United States Patent [19]
Benfante

[11] Patent Number: 6,015,314
[45] Date of Patent: Jan. 18, 2000

[54] ELECTRIC WATT-HOUR METER ADAPTER

[75] Inventor: Dennis J. Benfante, East Patchoque, N.Y.

[73] Assignee: Colsolidated Edison Company of New York, Inc., New York, N.Y.

[21] Appl. No.: 08/966,205

[22] Filed: Nov. 7, 1997

[51] Int. Cl.[7] .................................................. H01R 33/945
[52] U.S. Cl. ........................................... 439/517; 361/662
[58] Field of Search ............................ 439/517; 361/662, 361/668, 669, 667

[56] References Cited

U.S. PATENT DOCUMENTS

| | | | |
|---|---|---|---|
| 2,105,396 | 1/1938 | Bajkke ..................................... | 361/662 |
| 2,218,650 | 10/1940 | Larson ..................................... | 439/263 |
| 3,525,971 | 8/1970 | Glassman ................................. | 439/105 |
| 3,643,209 | 2/1972 | Coston .................................... | 439/517 |
| 3,806,857 | 4/1974 | Hubeny ................................... | 439/508 |
| 4,892,485 | 1/1990 | Patton ..................................... | 439/167 |
| 5,097,383 | 3/1992 | Heard et al. ............................. | 361/662 |
| 5,385,486 | 1/1995 | Robinson et al. ....................... | 439/517 |
| 5,620,337 | 4/1997 | Pruehs .................................... | 439/508 |

*Primary Examiner*—Khiem Nguyen
*Assistant Examiner*—T C Patel
*Attorney, Agent, or Firm*—Kramer Levin Naftalis & Frankel LLP

[57] ABSTRACT

An adapter provides full single phase electrical service when there is a partial electrical service failure to one of the line contacts of the watt-hour meter socket. The adapter includes a housing, wherein at least two line apertures are formed through the housing. A line electrical conductor is removably inserted through one of the line apertures to correspond to the live line contact of the meter socket. The line electrical conductor has a first end configured for being connected to the line contact of the watt-hour meter socket and a second end configured for being connected of contact of the watt-hour meter. At least two load apertures are formed through the housing. At least two load electrical conductors are each inserted through the load apertures. Each of the two load electrical conductors have a first end configured for being connected to a respective load contact of the watt-hour meter socket, and each of the two load electrical conductors have a second end configured for being connected to the watt-hour meter. A connector element connects the load electrical conductors to one another. When the watt-hour meter and the watt-hour meter socket are electrically connected with the adapter, energy consumption is measured by the watt-hour meter.

15 Claims, 3 Drawing Sheets

ELECTRIC WATT-HOUR METER ADAPTER

BACKGROUND OF THE INVENTION

1. Technical Field

The present invention generally relates to electric watt-hour meters and sockets. More particularly, the present invention relates to an adapter for connecting a watt-hour meter and a watt-hour meter socket during partial electrical service failure to one of the line contacts of the watt-hour meter socket.

2. Background Information

Watt-hour meters are employed by electrical utility companies to measure and record energy consumption at residential and commercial building sites. A conventional watt-hour meter is removably engaged to a watt-hour meter socket, which is usually mounted to the side of the building site. The watt-hour meter socket contains two conductive line contacts, often referred to as terminals, which are connected to the incoming electric power line conductors extending from the utility power distribution source. The watt-hour meter socket also includes two load contacts which are connected to the electrical distribution wiring of the building site. Each load contact channels single phase service (e.g. 110 volts) to the electrical distribution network, and can also provide two phase service (e.g., 220 volts) required for certain heavy appliances, such as air conditioners and refrigerators.

The watt-hour meter generally contains five contacts for being engaged to five corresponding contacts of the watt-hour meter socket. The watt-hour meter includes two input contacts which are electrically connected to the line contacts of the socket, two output contacts which are electrically connected to the load jaw contacts of the socket, and a neutral contact which is electrically connected to a neutral contact of the socket. Once the watt-hour meter is connected to the meter socket, an electrical circuit is completed so that the electrical power from the line conductors can be transmitted to the load contacts for ultimately providing electricity to the building site. The watt-hour meter records the electrical consumption used by the building site.

Occasionally, service to one of the line contacts in the meter socket fails or is otherwise interrupted, thereby terminating electric service to one side of the watt-hour meter socket. However, service to the other line contact in the socket is still operable, and electrical service is provided to at least a portion of the building site. Because there may be delays associated with restoring full two-phase service, the electric utility company may provide full single phase service to the entire building site by installing a temporary jumper into the customer's circuit breaker panel or meter socket. Once the full dual phase electrical service is restored, the utility company thereafter removes the temporary jumper.

In the conventional method of installing a temporary jumper, the utility person first determines which phase is not providing electricity. Thereafter, the dead wire located in the breaker panel is physically disconnected and tape is attached to the exposed end of the wire. The wire is then bent away to avoid any obstruction. The exposed end of the wire is taped as a safety measure in the event that electrical service is restored. The jumper is then physically installed so as to provide single phase service (e.g., 110 volts) to the entire building site.

In addition, plug-in type adapters are available for use to provide single phase service to both load contacts of the meter socket. Such adapters are employed to connect the live incoming line contact to both of the two outgoing load contacts. However, because the live line contact is connected directly to the load contacts, the watt-hour meter is bypassed so that the measurement of energy consumption is not possible. Therefore, the utility company must rely on estimating energy consumption rather than obtaining an actual meter reading. Also, a number of adapters use fuses to connect the live line contact to the two load contacts, which results in more component parts and therefore greater cost. An example of such an adapter is described in U.S. Pat. No. 5,620,337, entitled FUSED WATTHOUR METER BYPASS ADAPTER.

When there is a partial energy failure, the utility worker normally does not know which line conductor is dead until after testing the line contacts. Therefore, separate versions of the plug-in type adapters are required to correspond to where the live line contact is located. Thus, until now, a single adapter could not be easily and readily employed to provide full single phase service when service to either one of the line contacts fails.

Thus, a need exists for a watt-hour meter adapter that provides single phase service to two load contacts during failure of service to one of the line contacts. More specifically, there is a need for a single version of an adapter which can be easily and readily modified to provide the single phase service to both load contacts, irrespective of which line contact becomes dead. There is also a need for an adapter which can be used in conjunction with the watt-hour meter so that the meter can continue to measure electrical consumption during failure of service to one of the line contacts. The structure of the present invention contains a solution to the aforementioned problems. As defined below, the present invention provides a significant improvement over currently existing adapters, devices and methods used to provide single phase service during failure of service to one of the line contacts of the meter socket.

SUMMARY OF THE INVENTION

Briefly, the present invention satisfies these needs and overcomes the shortcoming of the prior art through the provision of an adapter for connecting a watt-hour meter and a watt-hour meter socket. This adapter includes a housing and at least two line apertures formed through the housing. A line electrical conductor is removably inserted through one of the line apertures. The line electrical conductor has a first end configured for being connected to a line contact of the watt-hour meter socket and a second end configured for being connected to a contact of the watt-hour meter. At least two load apertures are formed through the housing for receiving at least two load electrical conductors therethrough. Each of the load electrical conductors has a first end configured for being connected to a respective load contact of the watt-hour meter socket and a second end for being connected to a respective contact of the watt-hour meter. A connector is used to connect the load electrical conductors to one another. For example, a wire or a conductive plate may be employed to connect the load conductors. When the watt-hour meter and the watt-hour meter socket are electrically connected by way of the adapter, energy consumption is measured by the watt-hour meter.

The adapter of the present invention can be easily and readily modified to provide full electrical service when electrical service to either line contact fails. Thus, only one version of the adapter is needed by the utility worker to provide full single phase service, regardless of which line contact becomes dead. The adapter of the present invention can be quickly and simply modified in the field to accommodate either situation.

Therefore, it is a primary object of the present invention to provide an apparatus for easily and readily establishing electrical service to both load contacts of an electrical meter socket during failure of electrical service to one of the line contacts, without the need for separate versions to accommodate electrical service failure to the separately located line contacts.

It is another object of the present invention to provide an adapter which can be employed to maintain measurement of electrical power consumption when single phase service is provided to both outgoing load contacts of an electrical meter socket during failure of electrical service to one of the line contacts.

It is yet another object of the present invention to enhance the safety of servicing watt-hour meter equipment when service to one of the line contacts is temporarily interrupted.

These, and other objects, features and advantages of this invention will become apparent from the following detailed description of the preferred embodiment taken in conjunction with the accompanying drawings.

DETAILED DESCRIPTION

It will be readily apparent that the components of the present invention, as generally described and illustrated in the figures, could be arranged and designed in a wide variety of different configurations. Thus, the following detailed description of the presently preferred embodiments of the adapter for connecting an electric watt-hour meter and an electric watt hour meter socket, as represented in FIGS. 1–4, is not intended to limit the scope of the invention as claimed, but is merely representative of the presently preferred embodiments of the invention. The presently preferred embodiments of the invention will be best understood by references to the drawings, where like parts are designated with like numerals.

Figure 1:
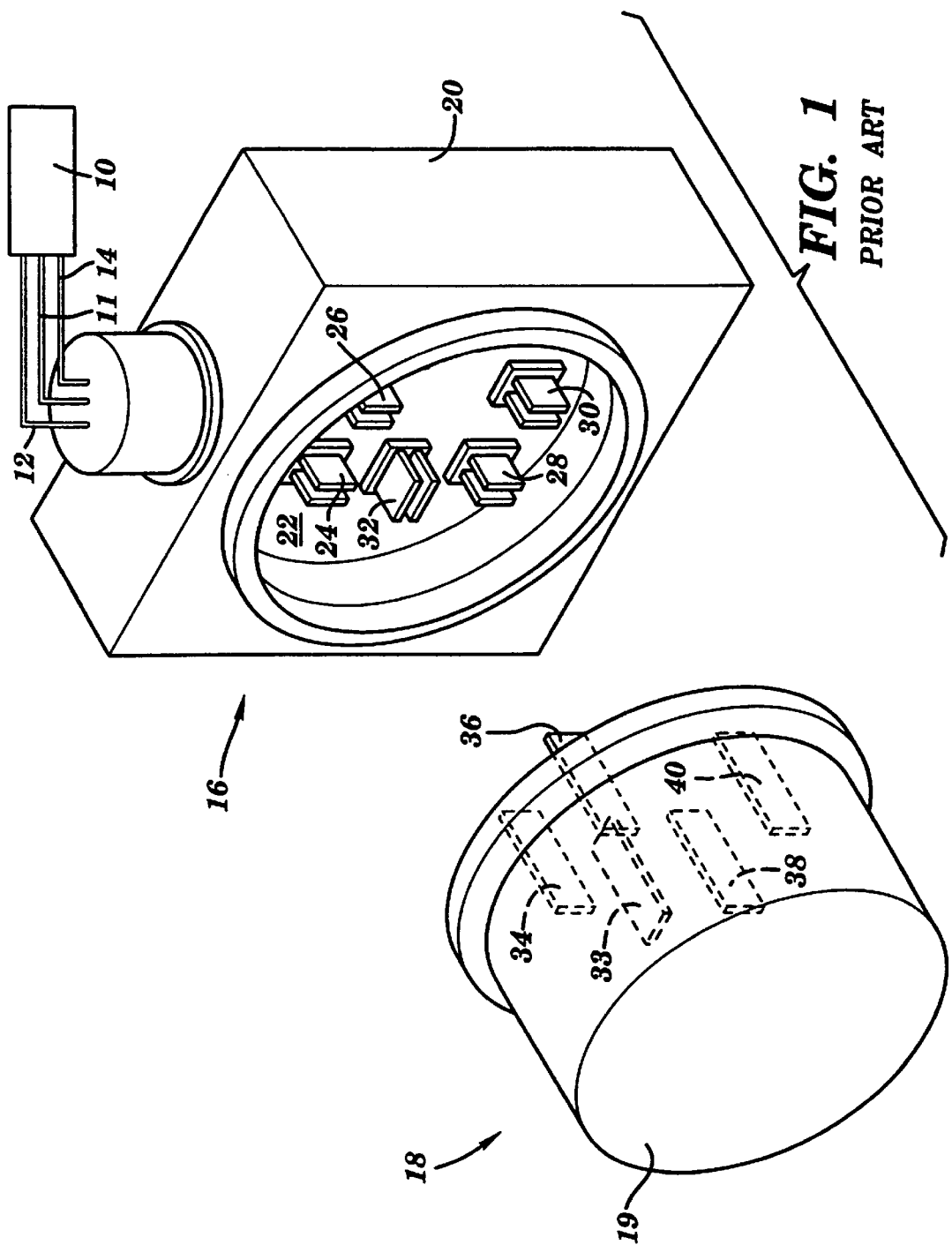
FIG. 1 is an exploded isometric view illustrating a conventional watt-hour meter and a watt-hour meter socket.

In a conventional electrical power distribution system, as shown in FIG. 1, a power source 10 may provide electrical power service to a residential or commercial building site (not shown) over two incoming line conductors 12, 14. The line conductors 12, 14 are connected to a standard electric watt-hour meter socket 16. In addition, a neutral line conductor 11 extends from power source 10 to meter socket 16. Typically, watt-hour meter socket 16 is mounted to the outer wall of the building site. In order to measure the electrical power consumed by the building site, a watt-hour meter 18 is removably attached to meter socket 16.

As illustrated in FIG. 1, watt-hour meter socket 16 includes a rectangularly-shaped casing or housing 20. A circular core 22 is formed partially through the front end of housing 20, wherein a plurality of electrical contacts are mounted therein for being connected to a plurality of corresponding contacts of watt-hour meter 18. For ease of engagement, watt-hour meter 18 includes a housing 19 which corresponds in shape and size to circular core 22 of watt-hour meter socket 16. The circuitry for measuring the electrical power consumption passing therethrough is housed within watt-hour meter 18.

Watt-hour meter socket 16 includes a first pair of line contacts, e.g., line jaw contacts 24, 26, located respectively at the first and third standard contact positions. Watt-hour meter socket 16 further includes a second pair of load contacts, e.g., load jaw contacts 28, 30, located at the standard second and fourth contact positions. As shown in the figures, line jaw contacts 24, 26 are positioned above load jaw contacts 28, 30. A neutral jaw contact 32 is also located in housing 20 between the upper load and lower line jaw contacts. The ends of line conductors 12, 14 terminate respectively at line jaw contacts 24, 26. Load jaw contacts 28, 30 are attached to the electrical distribution wiring system of the building site.

Watt-hour meter 18 includes a pair of line contacts, e.g., blade line contacts 34, 36 and a pair of load contacts, e.g., blade load contacts 38, 40. Watt-hour meter also includes a neutral blade contact 33. Each of these blade contacts are configured for being removably engaged to the jaw contacts of watt-hour meter socket 16. Therefore, each blade contact may resemble an elongated thin blade. When watt-hour meter 18 and watt-hour meter socket 16 are connected together, an electrical circuit is completed so that electrical energy can pass from the line contacts 24, 26 to the load contacts 28, 30 for distribution to the building site. Energy consumption is also measured as the energy passes through the meter 18.

At times, electrical service to one of the line contacts 24, 26 in electrical watt-hour meter socket 16 fails, thereby terminating electrical power service to one side of meter socket 16. However, service to the other line contact continues to operate and provides partial electrical service to the building site. For example, if the electrical service provided to line contact 24 is rendered inoperable, electrical service is only provided to a portion of the building site through remaining line contact 26. Accordingly, only corresponding load contact 30 channels electrical service to the building site, which results in various electrical appliances inoperable during the partial power failure.

In order to provide electrical service to both load contacts 28, 30 of watt-hour meter socket 16, while at the same time continuing use of watt-hour meter 18, watt-hour meter adapter 42 (FIG. 2) of the present invention can be safely and easily employed to bridge meter 18 and socket 16.

Figure 2:
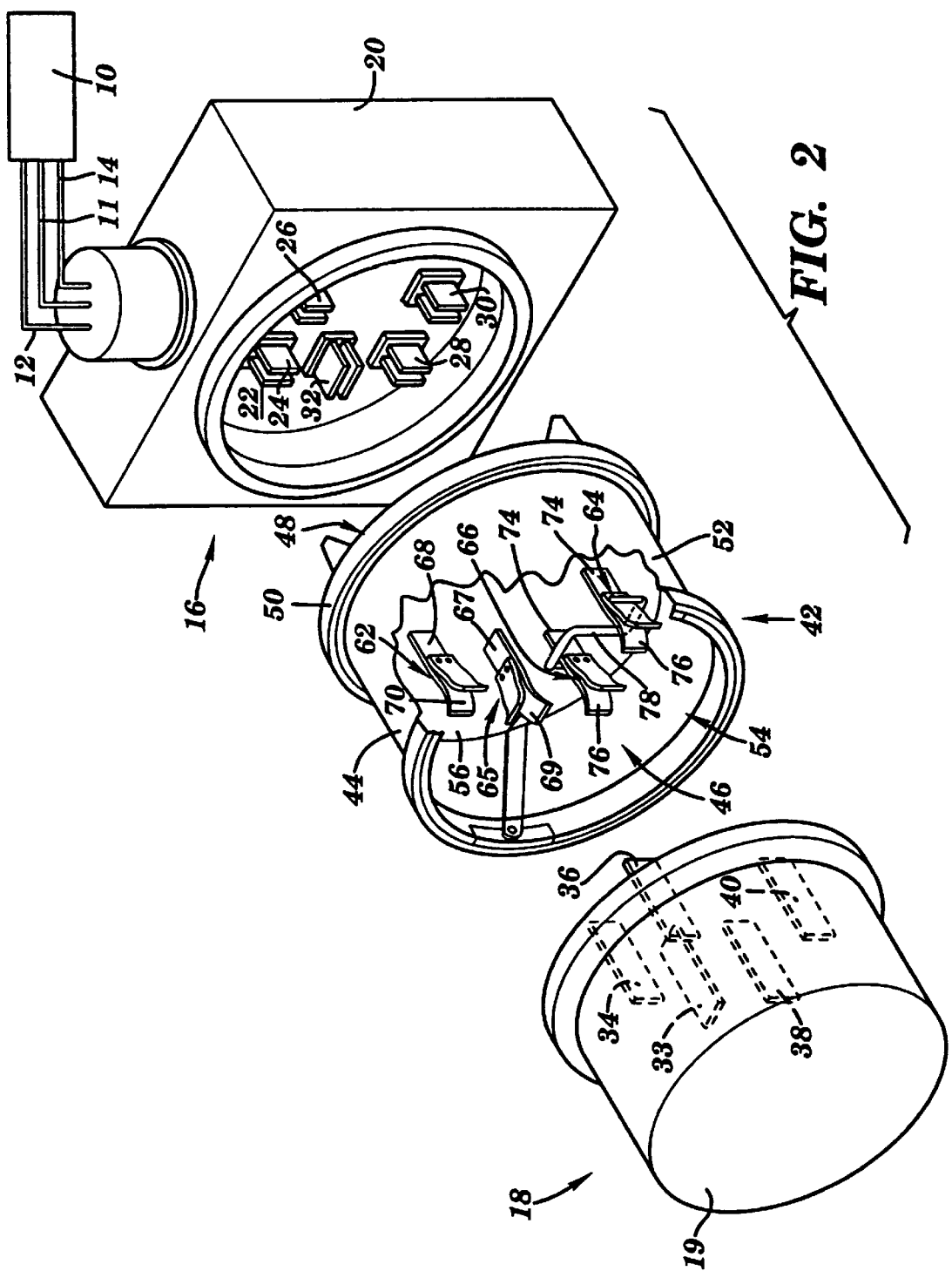
FIG. 2 is an exploded isometric view illustrating from left to right the watt-hour meter depicted in FIG. 1, a partially cut-away adapter constructed in accordance with the principles of the present invention, and the watt-hour meter socket shown in FIG. 1.

In reference now to the partly exploded view of FIG. 2, there is shown one embodiment of adapter 42 positioned between meter 18 and socket 16. For ease of illustration, adapter 42 is shown partially cutaway in FIG. 2. Adapter 42 comprises a housing 44, which is cylindrical in shape, having a first end 46 and a second end 46. A base 50 is formed at first end 48, with a side wall 52 extending therefrom. A hollow opening 54 is formed at first end 46. A bottom wall 56 is formed within opening 54, and an enclosed cavity (not shown) may be formed between base 50 and bottom wall 56. It is noted that the adapter of the present invention can be a modified version of an adapter manufactured by Exstrom Industries, Inc., of Farmington Hills, Mich., such as the 37-series meter adapters.

Figure 3:
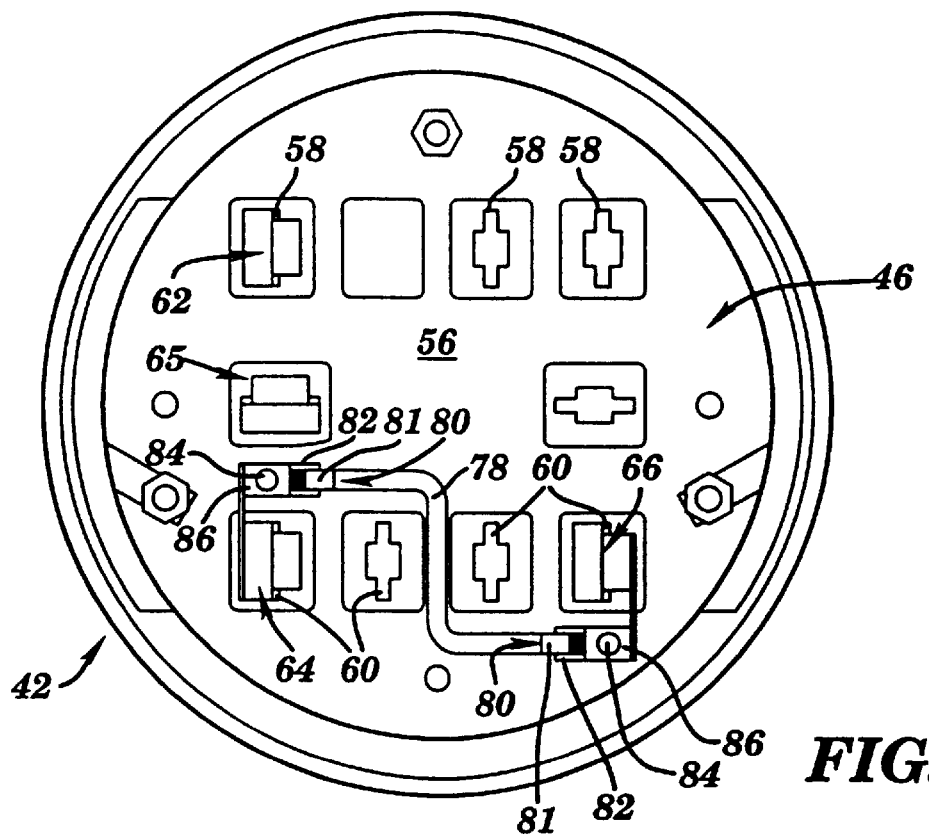
FIG. 3 is a front face of the adapter of FIG. 2 constructed in accordance with the principles of present invention.
Figure 4:
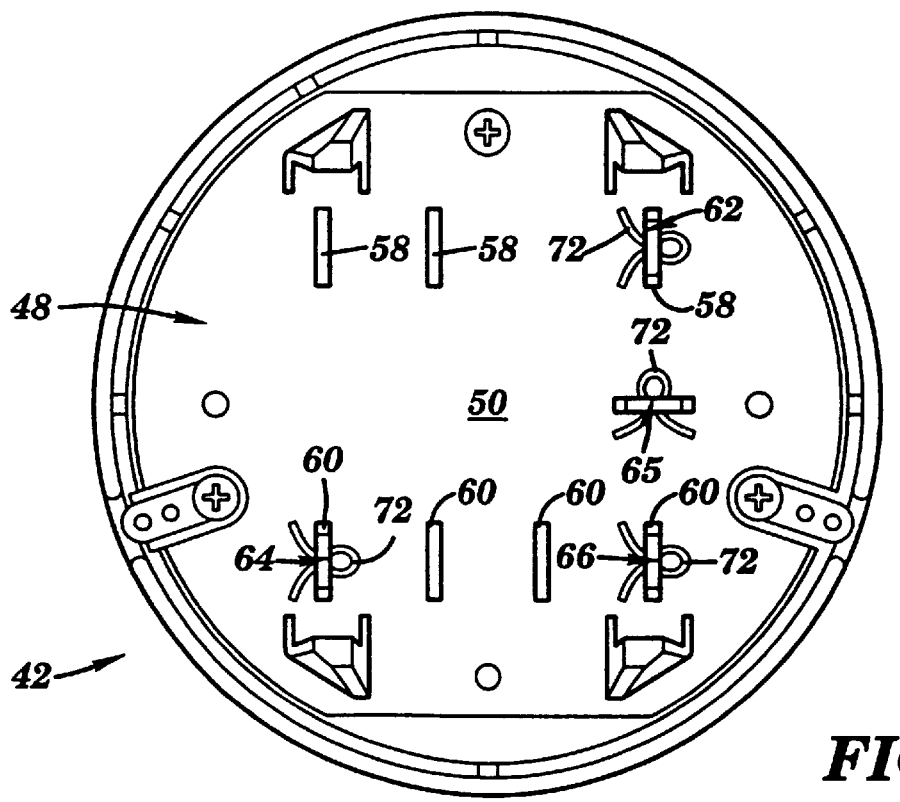
FIG. 4 is a rear face of the adapter illustrated in FIGS. 2 and 3.

As shown in FIGS. 3 & 4, a plurality of line apertures 58 and a plurality of load apertures 60 both are formed through base 50 and bottom wall 56. These apertures are configured for removably receiving line and load conductors therethrough. As illustrated in the figures, adapter 42 may include a line conductor 62 and a pair of load conductors 64, 66. Line conductor 62 may be removably inserted through any one of the plurality of line apertures 58. A neutral conductor 65 may be removably engaged to adapter 42.

Line conductor 62 has a first end 68 configured for being connected to one of line jaw contacts 24, 26 of watt-hour meter socket 16 and a second end 70 configured for being connected to one of blade contact 34, 36 of watt-hour meter 18. Therefore, preferably, first end 68 of line conductor 62 resembles a blade contact and second end 66 resembles a jaw contact. A means for securing, e.g., a cotter pin 72 (FIG. 4), is employed to secure line conductor 62 within each of the apertures 58.

A significant aspect of the present invention is the ease of moving line conductor 62 to any of the plurality of apertures 58. The versatility of such an adapter allows the utility worker to easily insert and secure the line conductor into the desired aperture, depending on the locale of the dead line contact. Such a configuration eliminates the need for different adapter versions to correspond to the location of the live line contact.

Each load conductor 64, 66 has a first end 74 configured for being engaged by jaw load contacts 28, 30, respectively, of watt-hour meter socket 42, and a second end 76 configured for being connected to blade contacts 38, 40, respectively, of watt-hour meter 18. Cotter pins 72 secure the load conductors within apertures 60.

Similarly, neutral conductor 65 has a first end 67 configured for being engaged by jaw neutral contact 32, and a second end 69 configured for being connected to blade contact 33 of watt-hour meter 18.

The conductors as described in the preferred embodiment comprise jaw and blade contacts, i.e., a male/female contact configuration. However, it should be noted that any contact configuration may be employed herein so long as a good electrical contact can be made between the elements.

In order to connect load conductors 64, 66 to each other, a connecting means bridges the two conductors. As shown best in FIG. 3, the connecting means preferably comprises a flexible wire 78. The terminal ends of flexible wire 78 are each removably attached to the two load conductors 64, 66. In the preferred embodiment, the terminal ends are attached to a metal or other conductive member 80. Metal member 80 includes a circular section 81 which acts to crimp the ends of the wires and a flat section 82 that protrudes therefrom. Flat section 82 has a hole formed therethrough for receiving a screw 84. Screw 84 attaches metal member 80 to a second conductive member 86 which is mechanically or otherwise secured to the respective load conductor.

While a flexible wire is preferably employed as the connector, it is noted any known mechanical means may be used in lieu thereof. For example, adapter 42 may be manufactured with a non-flexible shunt, e.g., a solid copper bar, to bridge the two load conductors 64, 66. It is also noted that any mechanical or other known means may be employed to attach the terminal ends of flexible wire 78 to load conductors 64, 66. For example, chemical bonding may be employed in lieu of the mechanical means described above.

When electrical service is interrupted to one of the incoming line contacts 12, 14 of meter socket 16, only partial electrical service is available to the building site. In implementing the principles of the present invention for providing single phase electrical service to the entire building site, a utility person determines which line contact 24, 26 of meter socket 16 is inoperable or dead. After determining which line contact is dead, the utility person employs adapter 42 to provide single phase electrical service to the entire building site.

More specifically, the utility worker will first remove the electric watt-hour meter 18 from the watt-hour socket to determine which load contact is dead. After determining the location of the dead load contact, the worker will arrange adapter 42 so that the line conductor 62 is properly placed in one of the plurality of line apertures 58 so as to correspond to the live line jaw contact of watt-hour meter socket 16. As shown in the example of FIG. 2, line conductor 62 corresponds to live load contact 24. Electrical service to load contact 26 is dead. Thereafter, the worker inserts adapter 42 into the socket and then inserts meter 18 into adapter 42. The adapter provides a simple and a safe technique for providing single phase service to the entire building upon failure of service to one of the load contacts.

While several aspects of the present invention have been described and depicted herein, alternative aspects may be effected by those skilled in the art to accomplish the same objectives. For example, while the preferred embodiments recite the use of a flexible wire as the connector, other connector configurations may be employed in lieu thereof. Also, while the preferred embodiment illustrated a system having two load and two line contacts, the present invention can be used in a system having any number of load and line contacts. Accordingly, it is intended by the appended claims to cover all such alternative aspects as fall within the true spirit and scope of the invention.

What is claimed:

1. An adapter for electrically connecting a watt-hour meter and a watt-hour meter socket, said adapter comprising:

a housing;

at least two line apertures formed through said housing;

a line electrical conductor selectively removably inserted through one of said at least two line apertures, said line electrical conductor having a first end configured for being connected to a line contact of said watt-hour meter socket and a second end configured for being connected to said watt-hour meter;

at least two load apertures formed through said housing;

at least two load electrical conductors, each inserted through a respective one of said at least two load apertures, each of said at least two load electrical conductors having a first end configured for being connected to a respective load contact of said watt-hour meter socket, and a second end configured for being connected to said watt-hour meter;

means for electrically connecting said at least two load electrical conductors to each other;

wherein when said watt-hour meter and said watt-hour meter socket are electrically connected to said adapter, energy consumption is measured by said watt-hour meter.

2. The adapter of claim 1, wherein said means for electrically connecting said at least two load electrical conductors is a flexible wire.

3. The adapter of claim 2, further comprising a screw, wherein said screw removably secures each end of said wire to said at least two load electrical conductors.

4. The adapter of claim 1, wherein said means for electrically connecting said at least two load electrical conductors is a shunt.

5. The adapter of claim 1, wherein said means for electrically connecting said at least two load electrical conductors is a conductor located in an enclosed cavity between said first end and said second end of said adapter.

6. The adapter of claim 1, wherein said first ends of said line electrical conductor and said load electrical conductors each have a male configuration, and said second ends of said line electrical conductor and said load electrical conductors each have a female configuration.

7. The adapter of claim 6, wherein said first ends of said line electrical conductor and said load electrical conductors each comprise blade contacts and said second ends of said line electrical conductor and said load electrical conductors each comprise jaw contacts.

8. The adapter of claim 7, wherein said blade contacts each comprise a conductive plate and each of said jaw contacts comprise two conductive plates joined together for being expanded apart to allow a watt-hour meter connector to be inserted therebetween.

9. The adapter of claim 1, wherein said first end of said line electrical conductor is configured for being removably inserted into and removed from each of said at least two line apertures and wherein said second end of said line electrical conductor is configured for being unable to pass through each of said at least two line apertures.

10. The adapter of claim 9, further comprising:

an aperture formed through said line electrical conductor proximate to said first end, said aperture being positioned outside of said housing when said line electrical conductor is inserted through said line aperture; and a fastener for securing said line electrical conductor to said housing.

11. The adapter of claim 10, wherein said fastener is a cotter pin.

12. The adapter of claim 1, wherein said housing includes a first side adapted for removable engagement with said watt-hour meter socket and a second side adapted for removable engagement with said watt-hour meter.

13. The adapter of claim 1, further comprising:

a neutral aperture formed through said housing; and a neutral electrical conductor inserted through said neutral aperture, said neutral electrical conductor having a first end configured for being connected to a neutral contact of said watt-hour meter socket, and a second end configured for being connected to a neutral contact of said watt-hour meter.

14. An adapter for electrically connecting a watt-hour meter and a watt-hour meter socket, comprising:

a housing;

a pair of line apertures formed through said housing;

a first electrical conductor selectively removably insertable through one of said pair of line apertures, said first electrical conductor having a first end adapted for being connected to a line contact of said watt-hour meter socket and a second end adapted for being connected to said watt-hour meter;

a pair of load apertures formed through said housing;

a pair of second electrical conductors each inserted through an associated one of said pair of load apertures, each of said pair of second electrical conductors having a first end adapted for being connected to an associated contact of said watt-hour meter socket, and a second end adapted for being connected to said watt-hour meter;

a connector for electrically connecting said pair of second electrical conductors;

wherein electrical power consumption is measurable when said adapter electrically connects said watt-hour meter and said watt-hour meter socket.

15. An adapter for electrically connecting a watt-hour meter and a watt-hour meter socket, comprising:

a housing;

an electrical conductor selectively removably attachable to said housing, said electrical conductor having a first end configured for being connected to an electrical power line contact of said watt-hour meter socket and a second end adapted for being connected to said watt-hour meter;

two electrical conductors attached to said housing, each of said two electrical conductors having a first end adapted for being connected to a respective electrical power load contact of said watt-hour meter socket, and a second end adapted for being connected to said watt-hour meter;

wherein when said watt-hour meter and said watt-hour meter socket are electrically connected by said adapter, electrical energy consumption is measured by said watt-hour meter.

* * * * *

UNITED STATES PATENT AND TRADEMARK OFFICE
CERTIFICATE OF CORRECTION

PATENT NO. : 6,015,314
DATED : January 18, 2000
INVENTOR(S) : Benefante

It is certified that error appears in the above-identified patent and that said Letters Patent is hereby corrected as shown below:

<u>Title page,</u>
Item [73], Assignee should be changed from Colsolidated Edison Company of New York, Inc." to -- Consolidated Edison Company of New York, Inc. --

Signed and Sealed this

Twenty-sixth Day of February, 2002

Attest:

Attesting Officer

JAMES E. ROGAN
Director of the United States Patent and Trademark Office